(12) United States Patent
Kanschat et al.

(10) Patent No.: US 8,253,237 B2
(45) Date of Patent: Aug. 28, 2012

(54) SEMICONDUCTOR MODULE ARRANGEMENT AND METHOD

(75) Inventors: Peter Kanschat, Bad Sassendorf (DE); Thilo Stolze, Arnsberg (DE)

(73) Assignee: Infineon Technologies AG, Neubiberg (DE)

( * ) Notice: Subject to any disclaimer, the term of this patent is extended or adjusted under 35 U.S.C. 154(b) by 270 days.

(21) Appl. No.: 11/846,278

(22) Filed: Aug. 28, 2007

(65) Prior Publication Data
US 2008/0054442 A1   Mar. 6, 2008

(30) Foreign Application Priority Data
Aug. 29, 2006   (DE) .................. 10 2006 040 435

(51) Int. Cl.
*H01L 23/48* (2006.01)
(52) U.S. Cl. .............. 257/696; 257/688; 257/717
(58) Field of Classification Search .......... 257/686, 257/666; 438/109
See application file for complete search history.

(56) References Cited

U.S. PATENT DOCUMENTS

| | | | | |
|---|---|---|---|---|
| 6,281,579 | B1 * | 8/2001 | Siu | 257/730 |
| 6,836,005 | B2 * | 12/2004 | Moriwaki | 257/678 |
| 7,235,880 | B2 * | 6/2007 | Prokofiev | 257/734 |
| 2003/0011057 | A1 * | 1/2003 | Nakajima et al. | 257/678 |
| 2003/0067065 | A1 | 4/2003 | Lee et al. | |

FOREIGN PATENT DOCUMENTS

| | | |
|---|---|---|
| JP | 09008223 | 1/1997 |
| JP | 2005033123 | 3/2005 |

* cited by examiner

*Primary Examiner* — Marcos D. Pizarro
*Assistant Examiner* — Suian Tang
(74) *Attorney, Agent, or Firm* — Dicke, Billig & Czaja, PLLC

(57) ABSTRACT

A power semiconductor arrangement and method is disclosed. One embodiment provides a power semiconductor module. An insulator is arranged between the module and a cooling element, increasing clearances between the power semiconductor module and the cooling element.

19 Claims, 6 Drawing Sheets

SEMICONDUCTOR MODULE ARRANGEMENT AND METHOD

CROSS-REFERENCE TO RELATED APPLICATIONS

This Utility Patent Application claims priority to German Patent Application No. DE 10 2006 040 435.1 filed on Aug. 29, 2006, which is incorporated herein by reference.

BACKGROUND

The invention relates to an arrangement and a method for mounting a power semiconductor module onto a cooling element. In one embodiment, the power semiconductor module has a module housing, in which connection contacts are led out laterally from the module housing parallel to the underside of the module housing.

A customary construction of a power semiconductor module and the arrangement thereof on a heat sink are illustrated in FIGS. 1 to 4. Power semiconductor components 5, 6, 7, 8, 9, 10, 11, 12 are situated on a substrate 2, which can be embodied as a ceramic substrate, leadframe, IMS (Insulated Metal Substrate). The power semiconductor components 5 to 12 are normally soldered onto the substrate. The external wiring of the substrate 2 is effected using a multiplicity of connection contacts 15, wherein the connection contacts 15 are typically fitted to the longitudinal edges of the substrate 2 using a leadframe 1.

It is also possible, instead of a substrate 2 with power semiconductor components 5 to 12, to connect the power semiconductor components directly to the leadframe. The leadframe 1 contains, alongside the connection contacts 15 that occupy all the connections of the substrate upon application of the leadframe, in addition peripheral webs 20, 21 that mechanically stabilize the connection contacts 15. The electrical contacts of the substrate 2 are peripherally fixed with the connection contacts 15 of the leadframe 1, wherein this fixing can be effected by soldering, welding, adhesive bonding or other connecting techniques.

A substrate 2 provided with power semiconductor components 5 to 7, which substrate forms a leadframe 1 using the connection contacts 15, is illustrated without a housing in FIG. 2. The peripheral webs 20, 21 of the leadframe 1 have been removed in this case.

In order to encapsulate the power semiconductor module, the leadframe 1 is encapsulated with plastic by injection molding, as illustrated in FIG. 3. In the process of encapsulation by injection molding, the mold parting of the injection mold always seals above the peripheral web 20 of the leadframe 1, which simultaneously orients and stabilizes the individual contacts 15 during the encapsulation by injection molding. In order to seal the injection mold, after the injection mold has been brought together (for directions of movement, see arrows in FIG. 3), the mold parting must always be brought to a defined area (dashed line in FIG. 3) corresponding to the inner part of the peripheral webs (20).

After the encapsulation by injection molding, superfluous connection contacts 15 that are not required according to the circuit layout of the substrate 2 and the peripheral webs 20, 21 are removed. For cost reasons, the removal can usually be effected using stamping. The leadframe 1 illustrated in FIG. 2 with a module housing 40 applied around it by injection molding is illustrated in FIG. 4. On account of the costs for the plastic used of the module housing 40, the housings 40 are made as flat as possible.

The power semiconductor module 3 finished in construction with a module housing 40 is mounted by the underside 50 onto a heat sink or cooling element 4 (FIG. 4), wherein the mounting is usually effected by screwing or clamping. The heat sink 4 serves for dissipating the power loss which arises in the power semiconductor components 5 to 12 and which occurs in the form of heat. As illustrated in FIG. 5, the module housing 40 bears by its module housing underside 50 on the heat sink 4 areally and without any gaps for an effective heat dissipation or a low heat transfer resistance and hence reliable operation of the power semiconductor module 3.

The connection contacts 15 of the power semiconductor module 3 are led out laterally from the module housing 40 parallel to the underside 50 of the module housing 40. For an external connection, the connection contacts 15 run outside the module housing in a manner leading away from the heat sink at an angle of greater than 180° with respect to the underside 50 of the module housing 40. Due to the arrangement of the connection contacts 15 with respect to the heat sink 4, which is grounded, the connection contacts 15 are at only a small distance from the heat sink 4 in that region in which the connection contacts are arranged outside the module housing 40 parallel to the underside 50 of the module housing 40.

The small distance between the connection contacts 15 and the heat sink 4, which can be merely a few millimeters, sometimes even less than 1 mm, is manifested in the form of a small air clearance 45 and a small creepage path 46, that is to say an excessively small insulation clearance. Therefore, power semiconductor modules 3 which—as illustrated in FIG. 5—are arranged on a heat sink can usually be used only for reverse voltages in the range up to 600 V. At higher voltages, in particular in the case of the widespread 1200 V class, complicated additional measures in the application construction have to be taken for the use of the power semiconductor modules 3.

Additional measures are necessary in order to upgrade the modules for higher voltage classes: alongside milled-out portions in the heat sink 4, in the case of modules that are not insulated with respect to the heat sink—usually when a pure leadframe is used as component carrier—additional insulator films are customary, although they impair the thermal properties of the arrangement of power semiconductor module and heat sink 4. The insulator films are always situated between the power semiconductor module underside 50 and the heat sink 4, wherein the films having a thickness of a few tenths of a millimeter usually include Kapton, polyimide or similar electrically insulating materials. Owing to these additional outlays, present-day power semiconductor modules which are encapsulated with plastic by injection molding and which are arranged on a heat sink are not used very widely in application with reverse voltages in the range up to 1200 V.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The ele

DETAILED DESCRIPTION

Figure 1:
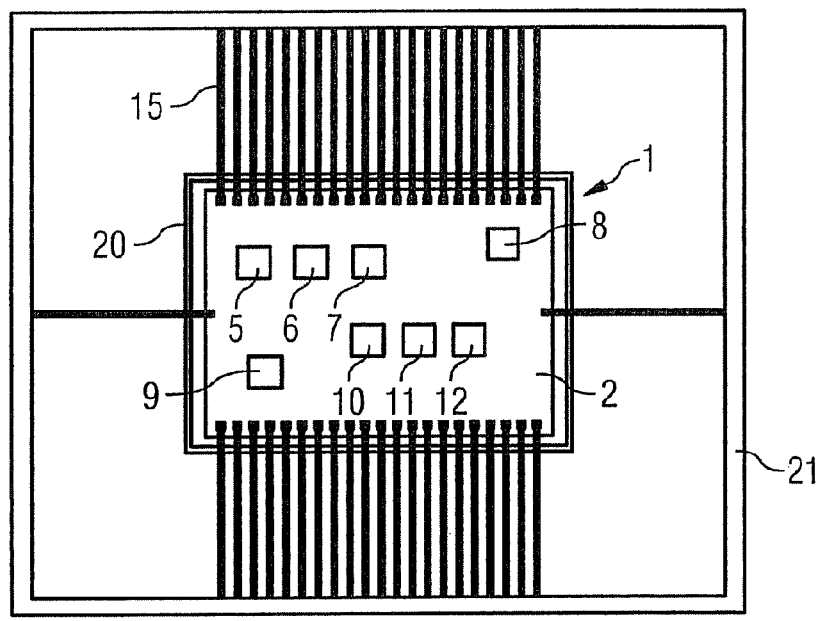
- FIG. 1 illustrates a plan view of a leadframe with substrate and power semiconductor components before the injection-molding operation.
Figure 2:
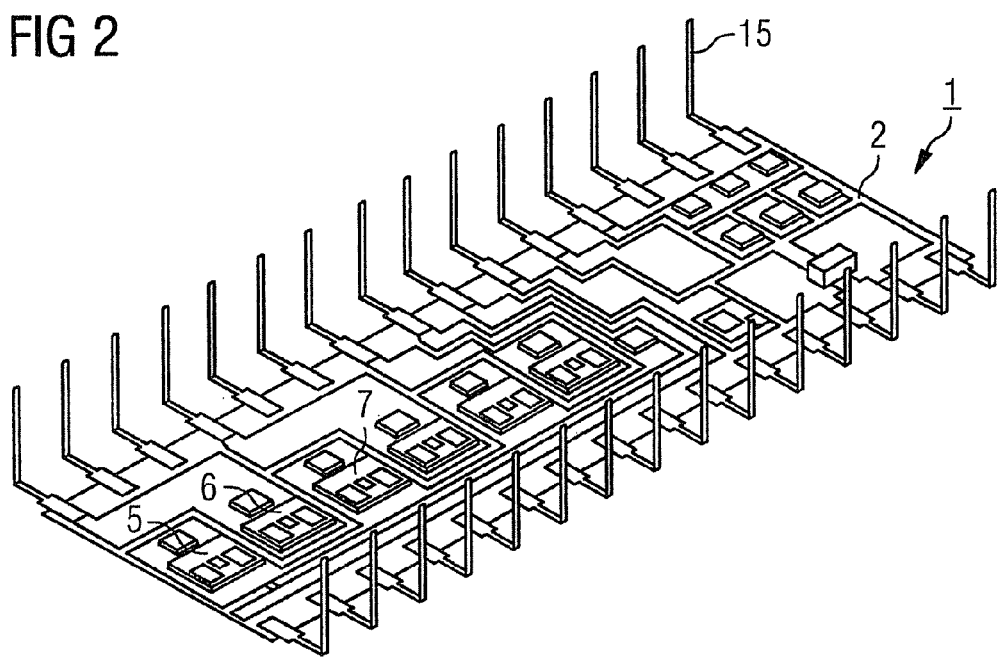
FIG. 2 illustrates the leadframe after the injection-molding operation without module housing.
Figure 3:
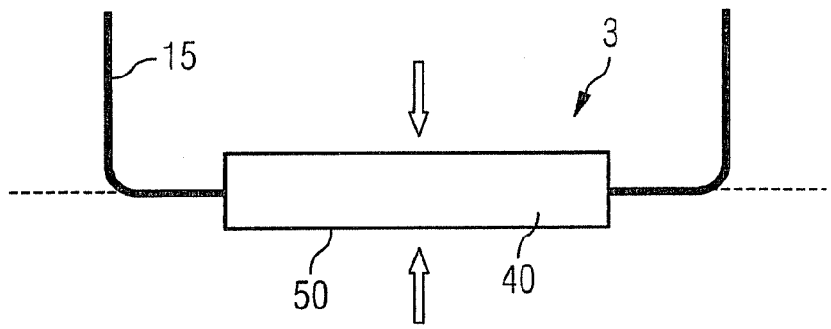
FIG. 3 illustrates the injection-molding operation around the leadframe from FIG. 2 in cross section.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One or more embodiments provide an arrangement of a power semiconductor module produced by an injection-molding method on a cooling element, where the arrangement is realized in a cost-effective manner and makes the power semiconductor component applicable for reverse voltages of greater than 600 V without impairing the thermal contact between cooling element and power semiconductor component underside and without having to take account of additional measures/outlays in the construction.

One embodiment provides using an arrangement in which an additional insulator frame is inserted between the power semiconductor module and the cooling element, whereby air and creepage clearances are lengthened.

One embodiment includes a multifunctional form of the insulator frame situated between the power semiconductor module and the cooling element. It is thus possible to dispense with individual parts that are to be separately produced, handled and mounted for fixing the insulator frame to the power semiconductor module or the cooling element. The insulator frame permits, in a single mounting operation, both the fixing of the insulator frame between the power semiconductor module and the cooling element and the production of an optimum thermal contact between the power semiconductor module and the cooling element.

A further embodiment consists in the fact that, alongside the desired lengthening of the air and creepage clearances, the position of the connection contacts lying outside the module housing is determined using the insulator frame. As a result, it becomes possible for the connection pins to be embodied also as press-fit contacts instead of as soldering contacts. As a result of the fixing of the connection contacts, the latter are protected during the process of press-fitting into e.g., a circuit board.

The form of the insulator frame arises from the form of the module housing and the course of the connection contacts outside the module housing. In one manner in terms of production engineering, the injection mold for the module housing is embodied such that a cutout is integrally formed peripherally on the underside of the module housing, wherein the cutout can be integrally formed without additional outlay. In the cutout, which can also be embodied as an incision at the module housing side or preferably at the module housing underside, the insulator frame is situated peripherally around the module housing in order to produce an insulating contact to the module housing.

The cutout is embodied as notching whereby the insulator frame can be latched into the module housing in a releasable manner on account of the elastic property of the plastic used for the insulator frame (PA, PBT or the like). In the further explanations, the cutout in the module housing is therefore referred to as notching.

The frame can be mounted onto the module housing directly after the injection molding of the module housing around the leadframe or later, that is to say before the mounting of the power semiconductor module onto the heat sink. Depending on the embodiment of the notching at the module housing, the insulator frame is latched together with the module housing or fixed to the latter by using an insulating adhesive.

The notching in the module housing furthermore enables the insulator frame to be able not just to peripherally surround the power semiconductor module, but rather to be fitted specifically where voltage-carrying connection contacts are situated above the insulator frame outside the module housing.

The insulator frame surrounding the module housing in an insulating manner can include two regions. A first region of the insulator frame is situated between that region of the connection contacts which runs parallel to the underside of the module housing, wherein the insulator frame bears on the cooling element. This results in a space-saving form of the insulator frame which, with optimum thermal contact between the power semiconductor module and the heat sink, does not increase the height of the power semiconductor module and leaves for the connection contacts emerging laterally from the module housing the free space necessary for avoiding electrical contact among the connection contacts.

A second region of the insulator frame, which region lies further outward with regard to the power semiconductor module and is adjacent to the first region, follows that region of the connection contacts in which the connection contacts are bent up toward the top in a manner leading away from the cooling element. The height of the outer boundary of the insulator frame is advantageous for the lengthening of the air and creepage clearances, wherein the distance between the connection contacts and the outer boundary of the insulator frame additionally lengthens the air and creepage clearances.

On account of the small height of the module housing with only a few millimeters and the connection contacts that usually emerge centrally at the side of the module housing, more than a doubling of the air and creepage clearances is produced for example even in the case of a height of the outer boundary of the insulator frame which corresponds to the height of the module housing.

Alongside the notching in the module housing, which can be effected as a rectangular incision in the simplest case, it is possible between power semiconductor module and insulator frame for the notching in the module housing to be embodied in the form of a ribbing for receiving the insulator frame. The ribbing, which latches into an intermeshing ribbing of the insulator frame, provides for the lengthening of the creepage path or gap between module housing and cooling element in comparison with the embodiment of the notching as a simple incision. As a result of the lengthening of the creepage path or gap, an insulating adhesive is not necessary depending on the required creepage path between module housing and insulator frame for electrical insulation.

In the simplest embodiment of the fixing of the insulator frame to the module housing, the notching can be omitted, such that the insulator frame is adhesively bonded directly laterally to the module housing in an insulating manner.

In addition latching hooks at the module housing and/or the insulator frame can also be present between the module housing and the insulator frame for mechanical fixing. The latching hooks, which can be integrally formed without additional outlay in the injection-molding operation, intermesh when the power semiconductor module is placed onto the cooling element and ensure a mechanical fixing.

As already mentioned, after the power semiconductor module has been mounted on the cooling element, the connection contact termination zones of the connection contacts can be press-fitted into contact regions continuing further, e.g., a circuit board. The form of the insulator frame that is oriented to the course of the connection contacts situated outside the module housing can then be utilized in this case. The forces occurring during the press-fitting operation on the connection contact termination zones and wires of the connection contacts are directed in the direction of the cooling element, perpendicular to the module housing underside. By using the insulator frame's outer boundary serving for lengthening the air and creepage clearances, the connection contacts are pressed onto the outer regions of the insulator frame during the press-fitting process.

In an embodiment of the insulator frame form in which the connection contacts are situated at the inner boundary of the insulator frame, the insulator frame partly takes up the press-fitting forces, whereby the position of the connection contacts can be maintained. Problems that usually occur, such as the bending or twisting of the connection contacts, are avoided in this way.

The effect of fixing the connection contacts during the press-fitting operation can be increased by virtue of the fact that the outer boundary of the insulator frame is embodied as far as below the connection contact termination zones of the connection contacts.

Furthermore, guide ribs can be introduced into the insulator frame for the additional fixing of the connection contacts, the guide ribs preventing the connection contacts from tilting in a direction running parallel to the lateral longitudinal edges of the substrate of the power semiconductor module. Like the form of the insulator frame itself, the guide ribs can be effected in the injection-molding process for producing the insulator frame.

A further enhancement of the positional definition of the connection contacts can be achieved by virtue of the fact that an additional frame is inserted into the insulator frame fitted to the power semiconductor module. Like the fixing of the module housing to the insulator frame, the fixing of the additional frame into the insulator frame can be effected by using notchings or ribbings. In addition, a mechanical fixing between the additional frame and the insulator frame can be effected by fitting latching hooks at the additional frame and/or the insulator frame. It goes without saying that the additional frame situated in the insulator frame can be embodied such that it can be plugged on the insulator frame in a positively locking manner.

Figure 6:
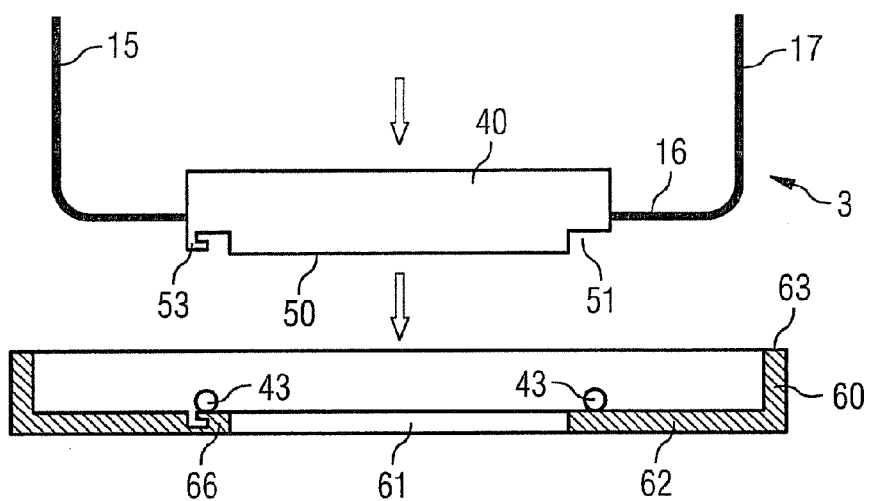
FIG. 6 illustrates in cross section an arrangement according to the invention for mounting a power semiconductor module into an insulator frame.

Power semiconductor module 3 illustrated in FIG. 6 has a module housing 40 and connection contacts 15. The connection contacts 15 are led out laterally from the module housing and have a region 16, which is parallel to the underside 50 of the module housing, and a region 17, which is adjacent to the region 16 and in which the connection contacts 15 form an angle of greater than 180° with respect to the underside 50 of the module housing 40.

The insulator frame 60 has a cavity 61, through which the power semiconductor module 3 is connected to the cooling element 4. Alongside a first region 62 of the insulator frame 60, the first region running parallel to the underside of the module housing, the insulator frame has a second region, which is adjacent to the first region 62 and follows that region of the connection contacts 15 in which the connection contacts 15 form an angle of greater than 180° with respect to the underside of the module housing 40. In the first exemplary embodiment in FIG. 6, the angle is 270°.

An insulating adhesive 43 is situated between the insulator frame 60 and the power semiconductor component 3 in a notching 51, which can run peripherally around the underside 50 of the module housing 40. The adhesive insulates the module housing from the cooling element 4 in such a way that an air gap between the module housing and cooling element 4 which runs through the insulator frame is avoided. An additional mechanical fixing between module housing 40 and insulator frame 60 can be effected by the introduction of latching hooks which can be situated in the region of the underside 50 of the module housing and at the edge of the cavity 61 of the insulator frame 60.

Figure 7:
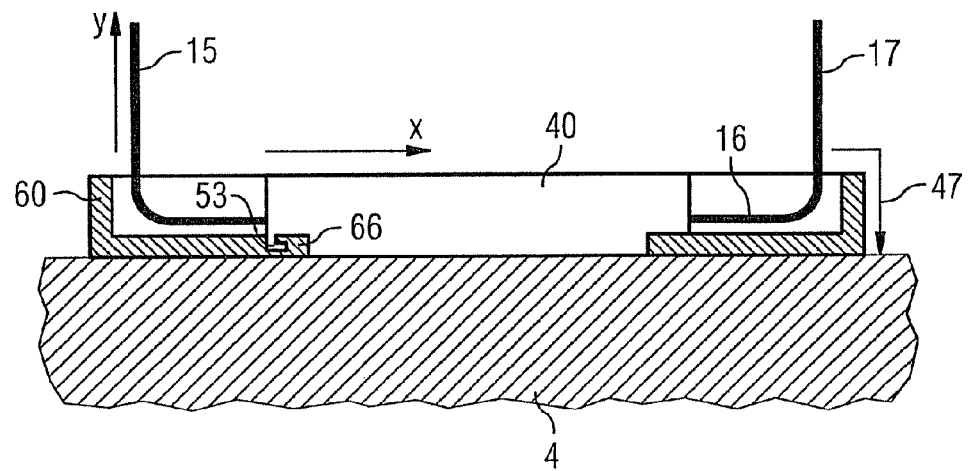
FIG. 7 illustrates in cross section the arrangement from FIG. 6 with cooling element in the mounted state.

The mounted arrangement of power semiconductor module 3, insulator frame 60 and cooling element 4 is illustrated in FIG. 7. The module housing 40 of the power semiconductor module 3 bears areally on the cooling element 4, wherein the insulator frame 60 is situated between the module housing 40 and the cooling element 4. The connection contacts 15 emerging laterally from the module housing, which connection contacts can include Cu or Cu alloys, for example, run outside the module housing 40 parallel to the underside 50 of the module housing 40 (direction X) and are bent upward further outside the module housing 40 in a manner leading away from the cooling element 4 (direction Y).

Figure 5:
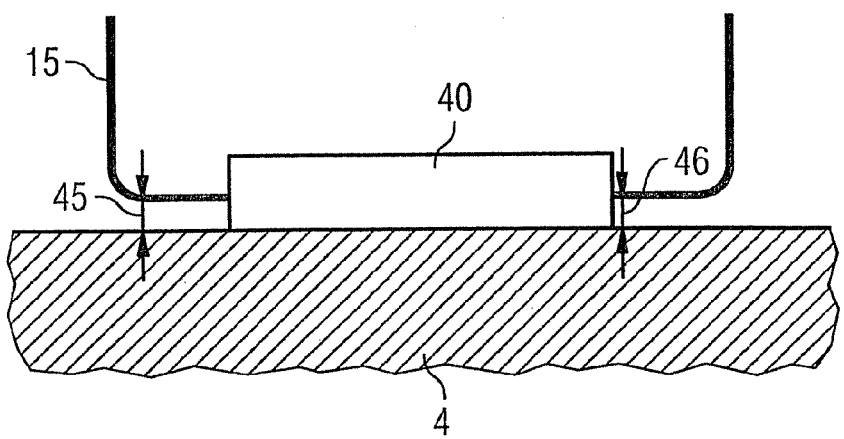
FIG. 5 illustrates a mounted conventional power semiconductor module on a cooling element (prior art).

The insulator frame 60 follows that region 16 of the connection contacts 15 which emerges from the module housing and which is parallel to the underside with a first region 62, to which a second region 63 is adjacent, the second region following that region of the connection contacts 15 in which the connection contacts form an angle of greater than 180° with respect to the underside of the module housing. On account of the distance between the region 63 and the connection contact region 70 and the height of the region 63 of the insulator frame 60, the lengthened creepage clearance 47 is produced, which simultaneously forms the lengthened air clearance. More than a doubling of the air and creepage clearances is produced in comparison with the air clearance 45 and creepage clearance 46 in FIG. 5, even in the case of a height of the region 60 which corresponds to the height of the module housing 40. In this case, the insulator frame does not lead to an increase in the module housing height.

The insulator frame does not have to be fixed to the cooling element 4 in addition to the screwing or clamping of the module housing 40, since the insulator frame 60 is situated between module housing 40 and cooling element 4 in a positionally defined manner. Alongside the mechanical fixing by using the notching 51, an additional fixing is effected by using the latching hooks 53, 66.

Figure 8:
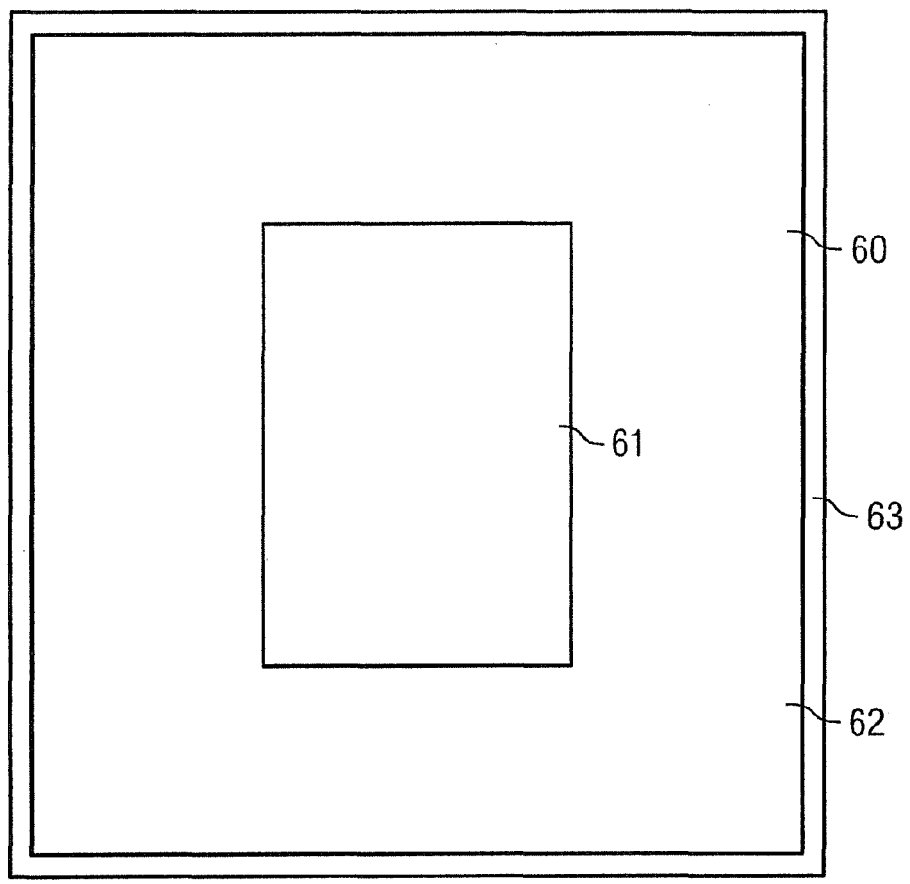
FIG. 8 illustrates in plan view the insulator frame from FIGS. 6 and 7.

A plan view of the insulator frame 60 from FIGS. 6 and 7 is illustrated in FIG. 8, wherein the region 62 adjoining the module housing 40 (not illustrated) and the outer boundary 63 can be seen alongside the opening 61.

Figure 9:
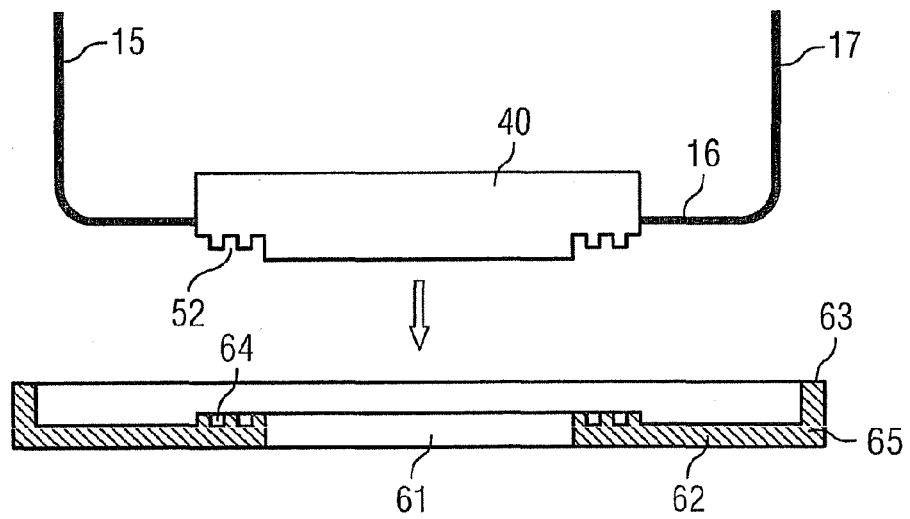
FIG. 9 illustrates in cross section an arrangement of power semiconductor module and insulator frame in a second embodiment.

The mounting of a further embodiment of the arrangement is illustrated in FIG. 9. Instead of the latching hooks 53, an additional mechanical fixing of the module housing to the insulator frame 65 is achieved by using the ribbing 52 in the module housing 40. The ribbing 52 latches into the insulator frame 65 by using an intermeshing ribbing 64, wherein, as a result of the lengthening of the creepage path, the insulation between module housing 40 and cooling element 4 (not illustrated) is increased to an extent such that an additional insulating adhesive 43 is not necessary.

As illustrated in FIG. 7, the outer region of the insulator frame 63 is only increased to an extent such that a sufficient reverse voltage can be applied to the power semiconductor module 3. That region 62 of the insulator frame which is parallel to the underside of the module housing 40 and the adjacent outer region 63 are spaced apart from the regions 16 and 17 of the connection contacts.

Figure 10:
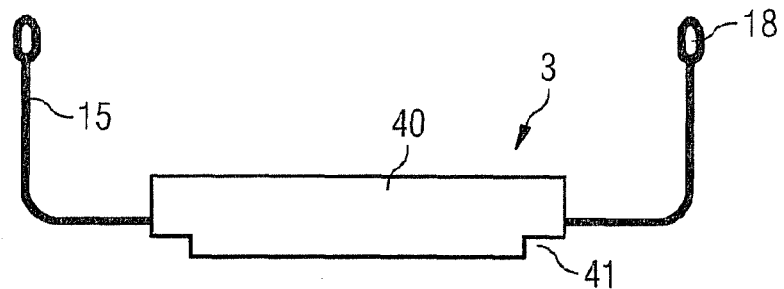
FIG. 10 illustrates in cross section a power semiconductor module with contact connection termination zones.

The power semiconductor module 3 in FIG. 10 illustrates a module housing 40 with connection contacts 15 similar to FIG. 6, wherein connection contact termination zones 18 are situated at the ends of the connection contacts. The connection contact termination zones 18 are press-fitted into further connection regions (not illustrated) in a process subsequent to the mounting.

Figure 11:
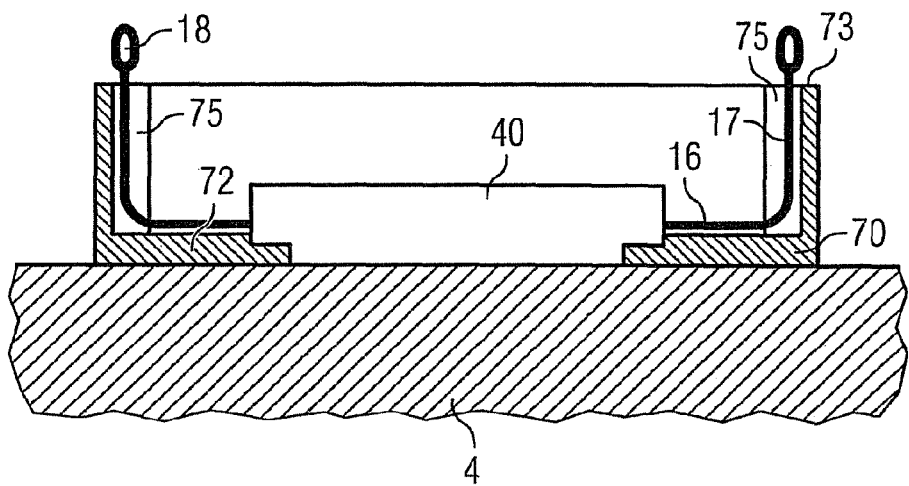
FIG. 11 illustrates in cross section an arrangement of power semiconductor module, insulator frame and heat sink in a third embodiment.

The mounted arrangement is illustrated in FIG. 11. In contrast to the arrangement from FIG. 7, the outer region 73 of the insulator frame 70 is embodied as far as below the contact connection termination zones 18. Both that region 16 of the connection contacts 15 which runs parallel to the underside of the module housing 40 and that region 17 of the connection contacts 15 in which the connection contacts 15 form an angle of greater than 180° with respect to the underside of the module housing 40 are spaced apart from the insulator frame 70 in such a way that the connection contacts 15 can bear gently on the insulator frame 70.

As a result of the forces which occur during the press-fitting of the contact connection termination zones 18 into further contact regions and which are directed onto the heat sink 4 and perpendicular to the underside of the module housing 40, the position of the contact connections 15 is determined by the regions 72 and 73 of the insulator frame 70. Possible damage to the connection contacts 15 (bends, twistings or the like) is avoided since the insulator frame 70 does not permit a significant change in the position of the connection contacts 15. In addition to the positional determination of the connection contacts 15 by using the regions 72, 73 of the insulator frame 70, further guide ribs 73 are introduced into the insulator frame 70. The guide ribs 73, which are integrally formed concomitantly in the injection-molding process for producing the insulator frame 70, serve for further delimiting the mobility of the contacts in a direction that is directed parallel to the longitudinal sides of the substrate 2.

Figure 4:
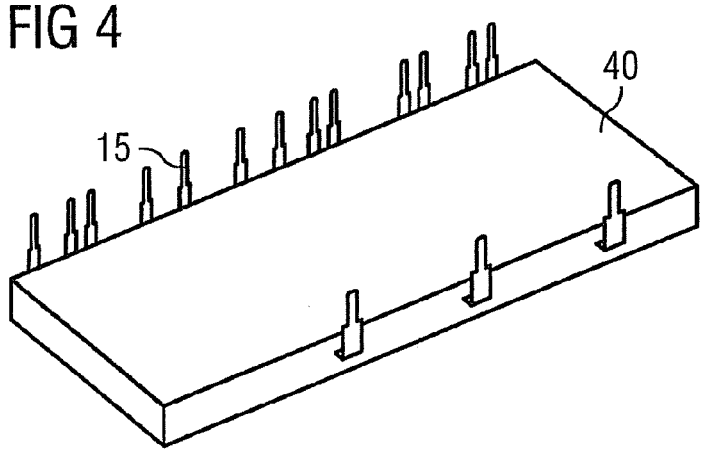
FIG. 4 illustrates a finished power semiconductor module with module housing after the injection-molding operation.
Figure 12:
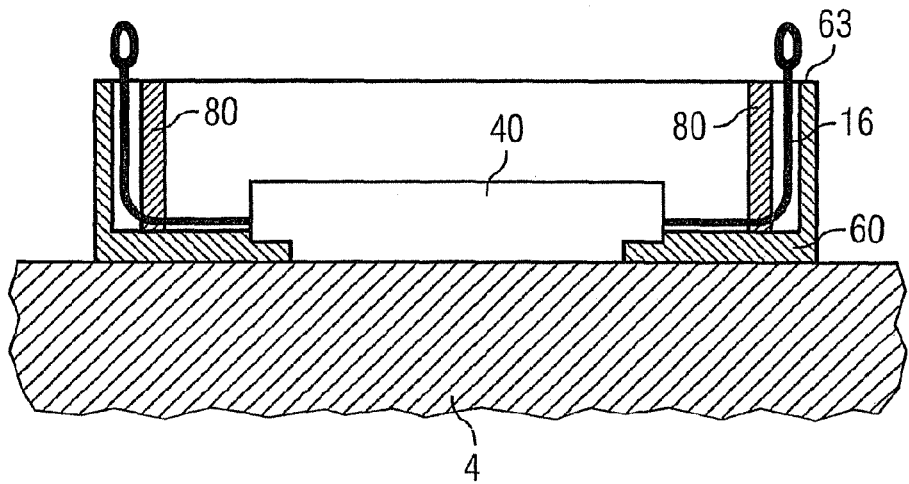
FIG. 12 illustrates in cross section an arrangement of power semiconductor module, insulator frame and cooling element in a fourth embodiment.

In addition to the measures for the positional determination of the connection contacts 15 during a press-fitting operation that are mentioned in FIG. 4, FIG. 12 illustrates one embodiment of the arrangement, in which an additional frame 80 is situated in the insulator frame 60 present. In this case, the frame 80 can be plugged onto the insulator frame 60 in a positively locking manner, wherein the height of the insulator frame, which is defined by the region 63, is not increased by the height of the frame 80.

Figure 13:
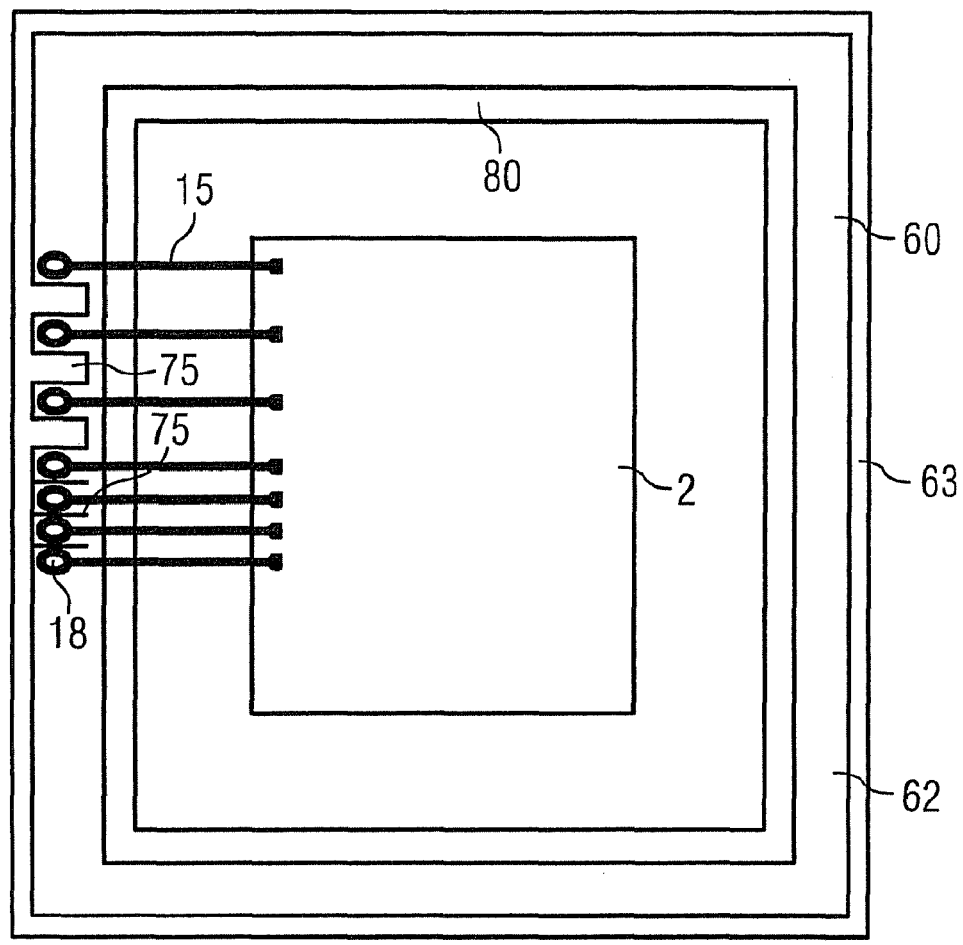
FIG. 13 illustrates in plan view the arrangement from FIGS. 11 and 12 without module housing.

FIG. 13 illustrates in a plan view the function of the guide ribs 75 and of the additional frame 80, wherein the module housing 40 has been removed for illustration purposes. The width of the guide ribs 75 is matched to the distance between the connection contacts 15, wherein a spacing apart from the substrate 2 is embodied in such a way that the additional frame 80 can be plugged onto the insulator frame 60 in a positively locking manner.

The position of the connection contacts 15 is completely determined through the simultaneous use of guide ribs 75 and additional frame 80 within the insulator frame 60. On account of the cross sections of the contact connections 15 which are too small for a process of press-fitting the contact connections 15 into further contact regions and which can be of the order of magnitude of 1 mm$^2$ or less, the guide ribs 75 and the additional frame 80 are necessary for maintaining the form and integrity of the contact connections 15. This likewise applies to cross-sectional forms of the contact connections 15 which can be square (0.64 mm edge length) or rectangular (0.8 mm×1.15 mm), and also for round cross sections (diameter 1 mm).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An arrangement, comprising:
   a power semiconductor module including connection contacts and a module housing of a plastic material, the connection contacts are led out laterally from the module housing parallel to the underside of the module housing, and also run outside the module housing at an angle of greater than 180 degrees with respect to the underside of the module housing;
   an insulator frame separate from the module housing and into which the module housing is seated such that the insulator frame is arranged between the connection contacts outside the module housing and a cooling element, wherein the insulator frame adjoins the module housing in an insulating manner and runs essentially parallel to the connection contacts,
   where the insulator frame has a first region, which follows that region of the connection contacts which is oriented parallel to the underside of the module housing; and wherein the insulator frame has a second region, which is adjacent to the first region and which follows that region of the connection contacts in which the connection contacts form an angle of greater than 180 degrees with respect to the underside of the module housing.

2. The arrangement of claim 1, comprising wherein the second region, which follows that region of the connection contacts in which the connection contacts form an angle of greater than 180 degrees with respect to the underside of the module housing, is embodied as far as below a connection contact termination zone of the connection contacts.

3. The arrangement of claim 1, comprising wherein the insulator frame is partly arranged between the module housing and the cooling element.

4. The arrangement of claim 3, comprising wherein the module housing has a cutout for receiving the insulator frame and the cutout defines the position of the insulator frame on the heat sink.

5. The arrangement of claim 3, comprising wherein the module housing has a ribbing for receiving the insulator frame and the insulator frame is defined in terms of its position by using an intermeshing ribbing and is latched into the module housing in an insulating manner relative to the heat sink.

6. The arrangement of claim 4, comprising wherein the module housing has a notching as cutout for receiving the insulator frame, wherein the insulator frame is fixed to the module housing in a releasable manner.

7. The arrangement of claim 1, comprising wherein the insulator frame is fixed to the module housing by using an insulating adhesive in order to avoid an air gap between the insulator frame and the module housing.

8. The arrangement of claim 1, comprising wherein latching hooks at the module housing or the insulator frame produce a mechanical fixing between the module housing and the insulator frame.

9. The arrangement of claim 1, comprising wherein the connection contacts are defined in terms of their position in a direction that leads laterally away from the module housing by using the second region, which follows that region of the connection contacts in which the connection contacts form an angle of greater than 180 degrees with respect to the underside of the module housing.

10. The arrangement of claim 9, comprising wherein the connection contacts are defined in terms of their position by using guide ribs in the insulator frame.

11. The arrangement of claim 1, comprising wherein the connection contacts are defined in terms of their position by insertion of an additional frame into the insulator frame.

12. The arrangement of claim 11, comprising wherein the frame is embodied such that it can be plugged onto the insulator frame in a positively locking manner.

13. The arrangement of claim 1, comprising wherein the insulator frame is fitted to the module housing in each case where voltage-carrying connection contacts are situated above the insulator frame.

14. The arrangement of claim 1, further including a latching mechanism which interlocks the module housing with the insulator frame.

15. The arrangement of claim 14, wherein the latching mechanism comprises a latch hook on the module housing which interlocks with a latch hook of the insulator frame.

16. The arrangement of claim 14, wherein the latching mechanism comprises a plurality of ribs on the module housing which latch with a plurality of intermeshing ribs on the insulator frame.

17. An arrangement, comprising:
a power semiconductor module including connection contacts and a module housing, the connection contacts are led out laterally from the module housing parallel to the underside of the module housing, and also run outside the module housing at an angle of greater than 180 degrees with respect to the underside of the module housing;
an insulator frame, arranged between the connection contacts outside the module housing and a cooling element, which adjoins the module housing in an insulating manner and runs essentially parallel to the connection contacts, which has a first region which follows that region of the connection contacts which is oriented parallel to the underside of the module housing, and which has a second region which is adjacent to the first region and which follows that region of the connection contacts in which the connection contacts form an angle of greater than 180 degrees with respect to the underside of the module housing; and
a latching mechanism which interlocks the module housing with the insulator frame.

18. The arrangement of claim 17, wherein the latching mechanism comprises a latch hook on the module housing which interlocks with a latch hook of the insulator frame.

19. The arrangement of claim 17, wherein the latching mechanism comprises a plurality of ribs on the module housing which latch with a plurality of intermeshing ribs on the insulator frame.

* * * * *